United States Patent
Lofgren et al.

(10) Patent No.: US 7,688,643 B2
(45) Date of Patent: Mar. 30, 2010

(54) DEVICE AND METHOD FOR CONTROLLING SOLID-STATE MEMORY SYSTEM

(75) Inventors: Karl M. J. Lofgren, Newport Beach, CA (US); Jeffrey Donald Stai, Placentia, CA (US); Anil Gupta, Irvine, CA (US); Robert D. Norman, San Jose, CA (US); Sanjay Mehrotra, Milpitas, CA (US)

(73) Assignee: SanDisk Corporation, Milpitas, CA (US)

( * ) Notice: Subject to any disclaimer, the term of this patent is extended or adjusted under 35 U.S.C. 154(b) by 283 days.

(21) Appl. No.: 10/809,061

(22) Filed: Mar. 24, 2004

(65) Prior Publication Data
US 2004/0186948 A1 Sep. 23, 2004

Related U.S. Application Data

(60) Continuation of application No. 10/785,373, filed on Feb. 23, 2004, now abandoned, which is a continuation of application No. 09/939,290, filed on Aug. 22, 2001, now Pat. No. 6,715,044, which is a continuation of application No. 09/657,369, filed on Sep. 8, 2000, now Pat. No. 6,317,812, which is a continuation of application No. 09/064,528, filed on Apr. 21, 1998, now Pat. No. 6,148,363, which is a continuation of application No. 08/931,193, filed on Sep. 16, 1997, now Pat. No. 5,806,070, which is a continuation of application No. 08/396,488, filed on Mar. 2, 1995, now abandoned, which is a division of application No. 07/736,733, filed on Jul. 26, 1991, now Pat. No. 5,430,859.

(51) Int. Cl.
*G11C 16/04* (2006.01)
*G06F 13/00* (2006.01)

(52) U.S. Cl. .............. 365/185.28; 365/185.11; 711/103; 711/154; 711/203

(58) Field of Classification Search ............ 365/185.11, 365/185.28
See application file for complete search history.

(56) References Cited

U.S. PATENT DOCUMENTS 4,393,481 A 7/1983 Owen et al.
(Continued)

FOREIGN PATENT DOCUMENTS

EP 0392895 B 12/1995
(Continued)

OTHER PUBLICATIONS

Office Action for U.S. Appl. No. 10/785,373, mailed Jul. 1, 2005, 6 pages.
(Continued)

*Primary Examiner*—Son L Mai
(74) *Attorney, Agent, or Firm*—Davis Wirght Tremaine LLP

(57) ABSTRACT

A memory system includes an array of solidstate memory devices which are in communication with and under the control of a controller module via a device bus with very few lines. This forms an integrated-circuit mass storage system which is contemplated to replace a mass storage system such as a disk drive memory in a computer system. Command, address and data information are serialized into component strings and multiplexed before being transferred between the controller module and the array of memory devices. The serialized information are is accompanied by a control signal to help sort out the multiplexed components. Each memory device in the array is mounted on a multi-bit mount and assigned an array address by it an array mount. An A memory device is selected by an appropriate address broadcast over the device bus, without requiring the usual dedicated select signal. A reserved array particular mount multi-bit configuration is used to unconditionally select the device mounted thereon. A reserved predefined address broadcast over the device bus deselects all previously selected memory devices. Read performance is enhanced by a read streaming technique in which while a current chunk of data is being serialized and shifted out of the memory subsystem devices to the controller module, the controller module is also setting up the address for the next chunk of data to begin to address the memory system.

11 Claims, 9 Drawing Sheets

U.S. PATENT DOCUMENTS

| | | |
|---|---|---|
| 4,398,248 A | 8/1983 | Hsia et al. |
| 4,481,579 A | 11/1984 | Kinghorn ................. 710/4 |
| 4,578,751 A | 3/1986 | Erwin |
| 4,614,194 A | 9/1986 | Jones et al. |
| 4,616,655 A | 10/1986 | Weinberg et al. |
| 4,670,748 A | 6/1987 | Williams ............. 340/14.31 |
| 4,715,017 A | 12/1987 | Iwahashi |
| 4,752,871 A | 6/1988 | Sparks et al. |
| 4,896,262 A | 1/1990 | Wayama et al. |
| 4,924,437 A | 5/1990 | Paterson et al. |
| 4,931,999 A | 6/1990 | Umeki |
| 4,953,129 A | 8/1990 | Kobayashi et al. |
| 5,028,986 A | 7/1991 | Sugano et al. |
| 5,043,940 A | 8/1991 | Harari |
| 5,053,648 A | 10/1991 | van den Elshout et al. |
| 5,060,195 A | 10/1991 | Gill et al. |
| 5,070,474 A | 12/1991 | Tuma et al. |
| 5,128,831 A | 7/1992 | Fox, III et al. |
| 5,163,021 A | 11/1992 | Mehrotra et al. |
| 5,168,335 A | 12/1992 | D'Arrigo et al. |
| 5,168,468 A | 12/1992 | Magome et al. |
| 5,172,338 A | 12/1992 | Mehrotra et al. |
| 5,200,959 A | 4/1993 | Gross et al. |
| 5,212,541 A | 5/1993 | Bergemont |
| 5,222,040 A | 6/1993 | Challa |
| 5,249,158 A | 9/1993 | Kynett et al. |
| 5,280,454 A | 1/1994 | Tanaka et al. |
| 5,289,429 A | 2/1994 | Watanabe |
| 5,297,103 A | 3/1994 | Higuchi |
| 5,297,148 A | 3/1994 | Harari et al. |
| 5,301,162 A | 4/1994 | Shimizu |
| 5,347,428 A | 9/1994 | Carson et al. |
| 5,347,490 A | 9/1994 | Terada et al. |
| 5,363,330 A | 11/1994 | Kobayashi et al. |
| 5,373,189 A | 12/1994 | Massit et al. |
| 5,392,253 A | 2/1995 | Atsumi et al. |
| 5,396,459 A | 3/1995 | Arakawa |
| 5,396,468 A | 3/1995 | Harari et al. |
| 5,422,842 A | 6/1995 | Cernea et al. |
| 5,430,859 A | 7/1995 | Norman et al. |
| 5,495,442 A | 2/1996 | Cernea et al. |
| 5,530,828 A | 6/1996 | Kaki et al. |
| 5,530,955 A | 6/1996 | Kaneko |
| 5,563,828 A | 10/1996 | Hasbun et al. |
| 5,581,498 A | 12/1996 | Ludwig et al. |
| 5,581,510 A | 12/1996 | Furusho et al. |
| 5,592,415 A | 1/1997 | Kato et al. |
| 5,603,001 A | 2/1997 | Sukegawa et al. |
| 5,606,532 A | 2/1997 | Lambrache et al. |
| 5,644,531 A | 7/1997 | Kuo et al. |
| 5,663,901 A | 9/1997 | Wallace et al. |
| 5,674,260 A | 10/1997 | Weinberg |
| 5,687,354 A * | 11/1997 | Koo ..................... 711/163 |
| 5,691,954 A | 11/1997 | Ooishi |
| 5,708,603 A | 1/1998 | Tanaka |
| 5,734,559 A | 3/1998 | Banerjee et al. |
| 5,765,185 A | 6/1998 | Lambrache et al. |
| 5,818,107 A | 10/1998 | Pierson et al. |
| 5,828,600 A | 10/1998 | Kato et al. |
| 5,845,066 A | 12/1998 | Fukuzumi |
| 5,845,313 A | 12/1998 | Estakhri et al. |
| 5,907,856 A | 5/1999 | Estakhri et al. |
| 5,910,913 A | 6/1999 | Kato et al. |
| 5,930,168 A | 7/1999 | Roohparvar |
| 5,930,815 A | 7/1999 | Estakhri et al. |
| 5,933,854 A | 8/1999 | Yoshimura |
| 5,987,357 A | 11/1999 | Prutchi et al. |
| 6,044,019 A | 3/2000 | Cernea et al. |
| 6,081,878 A | 6/2000 | Estakhri et al. |
| 6,101,123 A | 8/2000 | Kato et al. |
| 6,201,735 B1 | 3/2001 | Kato et al. |
| 6,202,138 B1 | 3/2001 | Estakhri et al. |
| 6,208,579 B1 | 3/2001 | Prutchi et al. |
| 6,272,042 B1 | 8/2001 | Kato et al. |
| 6,370,059 B2 | 4/2002 | Kato et al. |
| 6,397,314 B1 | 5/2002 | Estakhri et al. |
| 6,459,616 B1 | 10/2002 | Beauchamp et al. |
| 6,525,986 B2 | 2/2003 | Prutchi et al. |
| 6,538,926 B2 | 3/2003 | Kato et al. |
| 2002/0052633 A1 | 5/2002 | Prutchi et al. |

FOREIGN PATENT DOCUMENTS

| | | |
|---|---|---|
| JP | 62-276878 | 12/1987 |
| JP | 1-229497 | 9/1989 |
| JP | 3-219496 | 8/1991 |
| JP | 4-14871 | 1/1992 |

OTHER PUBLICATIONS

Office Action for U.S. Appl. No. 10/785,373 mailed Dec. 29, 2005, 7 pages.

"8 Megabit High Speed CMOS SRAM", *Dense-Pac Micro-system*, DPS512x16MKn3, pp. 1-8, (Feb. 1996).

Tuckerman et al., "Laminated Memory: A New-3-Dimensional Packaging Technology for MCMs," *IEEE*, 1994, pp. 58-63 (1994).

Xicor Data Book, "Electrically Erasable PROM," pp. 2-17 through 2-25, Xicor, Inc., 1985.

Xicor, "Electrically Erasable Prom," pp. 2-33 through 2-42, Xicor, Inc.

Xicor, "Serial E$^2$Prom," pp. 1-15, Xicor Inc., 1991.

Xicor, "Serial E$^2$Prom," pp. 2-107 through 2-117, Xicor Inc., 1991.

Judgment—Motions—Bd.R. 127, Prutchi v. Lofgren, Patent Interference No. 105,581 (JL), Oct. 23, 2008, 3 pages.

Decision—Motions—Bd.R. 125(a), Prutchi v. Lofgren, Patent Interference No. 105,581 (JL), Oct. 23, 2008, 23 pages.

Lofgren Opposition 1, Prutchi v. Lofgren, Patent Interference No. 105,581 (JL), Apr. 21, 2008, 57 pages.

Declaration, B.d.R. 203(b), Prutchi v. Lofgren, Patent Interference No. 105,581 (JL), Oct. 1, 2008, 8 pages.

Prutchi Motion 1, Prutchi v. Lofgren, Patent Interference No. 105,581 (JL), Feb. 11, 2008, 33 pages.

Prutchi Reply 1, Prutchi v. Lofgren, Patent Interference No. 105,581 (JL), May 23, 2008, 74 pages.

* cited by examiner

| Device Select Pins | Shift-in from SI0,SI1 | DS (Device Select) |
|---|---|---|
| 11111 (Master-select code) | Don't care | (selected) |
| 11000 (example) | 11000 (matched) | (selected) |
| 11000 (example) | 00001 (not matched) | (no change) |
| 11000 (example) | 11111 (Deselect code) | (deselected) |

DEVICE AND METHOD FOR CONTROLLING SOLID-STATE MEMORY SYSTEM

CROSS REFERENCE TO RELATED APPLICATIONS

This application is continuation of application Ser. No. 10/785,373, filed on Feb. 23, 2004 now abandoned, which is continuation of application Ser. No. 09/939,290, filed on Aug. 22, 2001 now U.S. Pat. No. 6,715,044, which is a continuation of application Ser. No. 09/657,369, filed on Sep. 8, 2000, now U.S. Pat. No. 6,317,812, which in turn is a continuation of application Ser. No. 09/064,528, filed on Apr. 21, 1998, now U.S. Pat. No. 6,148,363, which in turn is a continuation of application Ser. No. 08/931,193, filed on Sep. 16, 1997, now U.S. Pat. No. 5,806,070, which in turn is a continuation of application Ser. No. 08/396,488, filed on Mar. 2, 1995, now abandoned, which in turn is a divisional of application Ser. No. 07/736,733, filed on Jul. 26, 1991, now U.S. Pat. No. 5,430,859.

BACKGROUND OF THE INVENTION

This invention relates generally to a device and method for electronic data communication and particularly that between a memory controller and an array of memory chips.

Conventional memory system design uses a large number of parallel signals for the addressing, data transfer, and control of system operations. This is a very convenient means of configuring memory systems and results in very fast system operation. This is particularly true for integrated circuit, random access memory devices.

A disadvantage arises from this approach in that a large number of signal lines needs to be routed to each and every memory device in the memory system. This entails rather inefficient use of printed circuit board area and large cables and backplanes. Also, the system power supply must have higher capacity in order to deliver higher peak power for parallel signalling. In most cases, however, this inefficiency must be tolerated in order to achieve best possible speed of operation.

In some applications, on the other hand, it is possible to employ a serial link between two systems in order to reduce the number of cables therebetween, as well as the size of the cables, backplanes, and circuit boards in the systems. Overall, physical density can be dramatically improved over conventional methods, in that circuit boards can be made smaller and the total physical volume required for the connecting systems can be reduced. However, serial connections are usually slower than their parallel counterparts.

It is desirable to have simple connections between a memory controller and an array of memory devices, without compromising performance.

SUMMARY OF THE INVENTION

Accordingly, it is an object of the present invention to simplify the connections between two systems with minimum compromise on performance.

It is another object of the present invention to simplify the connections between a controller and an array of solid-state memory devices.

It is another object of the invention to provide means and method for improvements in selecting one or more memory devices within the a memory array for communication.

It is also an object of the invention to provide means and method for de-selecting the improvements in deselecting memory devices which have previously been selected for communication.

It is yet another object of the present invention to allow the memory devices of the memory array to be configured so that they are all enabled for simultaneous communication.

It is yet another object of the present invention to improve the speed of the memory devices.

These and additional objects are accomplished by improvements in the architecture of a system comprising a memory controller and an array of solidstate memory devices, and the circuits and techniques therein.

According to one aspect of the invention, an array of solid-state memory devices are in communication with and under the control of a controller module via a device bus with minimum lines. This forms an integrated circuit memory system which is contemplated to replace a mass storage system such as a disk drive memory in a computer system. Command, address and data information are serialized and multiplexed before being transferred between the controller module and the memory subsystem. The serialized information are is accompanied by a control signal to help sort out the multiplexed components. When the control signal is asserted, a circuit on each memory device of the subsystem interprets the serialized bits of information as a pointer code. After the control signal is de-asserted, deasserted, the each device routes subsequent bits of the serialized information to the appropriate command, address or data registers according to the type of information pointed to by the code.

The present invention uses a serial link to interconnect between the solid-state memory devices and the controller module. The serial link greatly reduces the number of interconnections and the number of external pads for each device, thereby reducing cost. Also expansion of the memory capacity of the system is simply achieved by a higher packing density of devices on standard printed circuit boards. It is not necessary to have a variety of circuit boards for each density, since the number of address and chip select signals does not change with capacity.

An important aspect of the invention is to employ a broadcast select scheme to select or enable a given memory device chip among an array of chips in a memory board or memory module. Each memory device chip has a multi-bit set of pinouts that is connected internally to a device select circuit and externally to a multi-bit mount on the memory module's backplane. Each multi-bit mount on the backplane is preconfigured pre-configured or keyed to a given address (represented by a multi-bit combination of "0"s and "1"s) according to its location in the array. In one embodiment, the terminals in the multi-bit mount corresponding to the "0" bit are set to ground potential. When a memory chip is powered on, the address of the array as defined by the mount key is passed onto the device select circuit of the chip. To select a given memory chip, the correct array address for that chip is sent to all the chips in the array via the interconnecting serial bus. This address is compared at each chip with that it acquired from its each chips mount, and the chip that matched is selected or enabled by its device select circuit. A memory chip remains selected until explicitly deselected, allowing more than one memory chip to be enabled at a time.

The invention provides a simple scheme for assigning an array address to each of the chips mounted on a memory module's backplane. By providing the keying at the backplane instead of at the memory chip s, the memory chips can be made generic. This also avoids the need for conventional use of using conventional individual chip select to enable each memory chip. This results in very low pin count in multi-chip modules, especially that of socketed modules, enabling high density package packing of memory chips on memory modules.

According to another aspect of the invention, the array of memory chips may be distributed over a plurality of memory modules. Each of the memory modules can be enabled by a module select signal from the controller module.

According to another aspect of the invention, each memory module may be further partitioned into a plurality of memory submodules. These submodules may be mounted on a memory module's backplane and are all enabled by the same module select signal. The multi-bit address in the multi-bit mount for each memory device is partitioned into two subsets. The permutations of one subset are used to provide the different memory-device addresses on a memory submodule. The permutations of the other subset are used to provide the different memory-submodule addresses on a memory module. Thus, there is a pre-configured preconfigured multi-bit mount for each memory submodule on the memory module's backplane.

According to another aspect of the invention, one particular key among the permutations of the multibit mounts is reserved as a "master key" to unconditionally have each device select circuit enable its chip. In the preferred embodiment, this "master key" is given by having all the bits of a multi-bit mount not grounded. This allows a group of chips with this "master key" mount to be selected together.

According to yet another aspect of the invention, the broadcast select scheme has a reserved code that can be communicated to the array of memory chips on the backplane in order to deselect all previously selected chips. In the preferred embodiment, a select sequence of shifting in a pattern of all ones results in a global deselect.

Another important aspect of the invention is to implement a streaming read scheme to improve the read access of the memory system. While a chunk (e.g. 64 bits) of data is being read from the memory cells, serialized and shifted out of a memory chip, the address for the next chunk is being setup and sent to the memory chip to begin accessing the next chunk of data. The overlapping operations of reading out of one chunk of data and staging for the access of the next chunk of data greatly improve the read access speed of the memory system.

As mentioned before, the use of a serial link is unconventional for integrated circuit memory chips. These memory devices are typically random-access memories which are designed for high speed access and therefore employ parallel address and data buses. Serializing the command, address and data information for these devices is unconventional since it may require more circuitry than conventional parallel access, and may result in slower access. However, the present invention, when used in a block transfer regime (e.g., reading 4096 consecutive user bits at a time, is relatively insensitive to access time, the speed being determined largely by the data throughput once reading has begun. The present invention recognizes that employment of a serial link in the present EEPROM electrically erasable programmable read only memory ("EEPROM")system architecture, particularly with the features of broadcast selection and streaming read, results in simplified connections therein without compromising access speed for the intended application.

Additional objects, features and advantages of the present invention will be understood from the following description of the preferred embodiments, which description should be taken in conjunction with the accompanying drawings.

BRIEF DESCRIPTION OF THE DRAWINGS

FIG. 6C (or Table 1) shows the logic of the device select circuit in FIGS. 4-6B.

DETAILED DESCRIPTION OF THE PREFERRED EMBODIMENTS

Figure 1A:
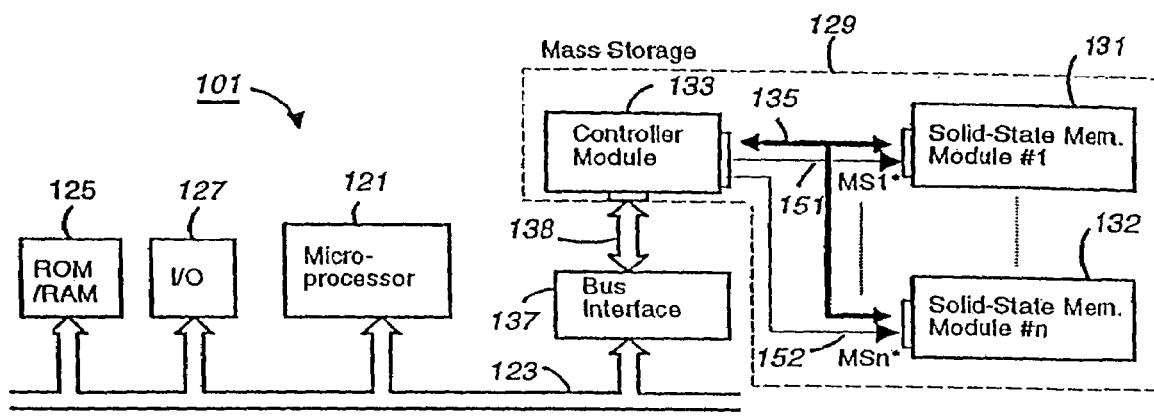
FIG. 1A is a general microprocessor system connecting connected via a bus interface to a solid-state mass storage system according to a preferred embodiment of the present invention.

A typical computer system in which the various aspects of the present invention are incorporated is illustrated generally in FIG. 1A. A typical computer system 101 has an architecture that includes a microprocessor 121 connected to a system bus 123, along with random access, main system memory 125 (which may include read only memory (ROM) and random access memory (RAM), and at least one or more input-output (I/O) devices 127, such as a keyboard, monitor, modem and the like. Another main computer system component that is connected to a typical computer system bus 123 is a large amount of long-term, nonvolatile memory 129. Conventionally, such a mass storage is a disk drive with a capacity of tens of megabytes of data storage. During the functioning of the computer system 101, data from this mass storage 129 is retrieved into the system volatile RAM of main system memory 125 for processing, and new or updated data can be easily written back to the mass storage.

One aspect of the present invention is the substitution of a specific type of semiconductor memory system for the disk drive but without having to sacrifice non-volatility, ease of erasing and rewriting data into the memory, speed of access, and reliability. This is accomplished by employing an array of non-volatile, solid-state memory, integrated circuit chips. This type of memory has additional advantages of requiring less power to operate, and of being lighter in weight than a hard disk drive memory, thereby being especially suited for battery-operated portable computers.

The integrated circuit mass storage memory 129 includes one or more solid-state memory modules such as 131, 132 under the control of a controller module 133. Addresses, data, and commands are communicated between the memory modules 131, 132 and the controller module 133 by means of a device bus 135. The one or more memory modules such as 131, 132 can be selectively enabled by individual module select signals such as MS1*, MS2*. These signals are carried in select lines such as 151, 152 from the controller module to individual memory modules. The controller module 135 is connected to a bus standard computer bus interface 137 via an interface bus 138. The interface 137 is connected on the other hand to the computer system via the standard computer system bus 123. The mass storage memory is adapted to be powered by a standard power supply within the computer system. For personal computer systems the bus interface 137 is preferably an IDE (Integrated Device Electronics) controller.

Figure 1B:
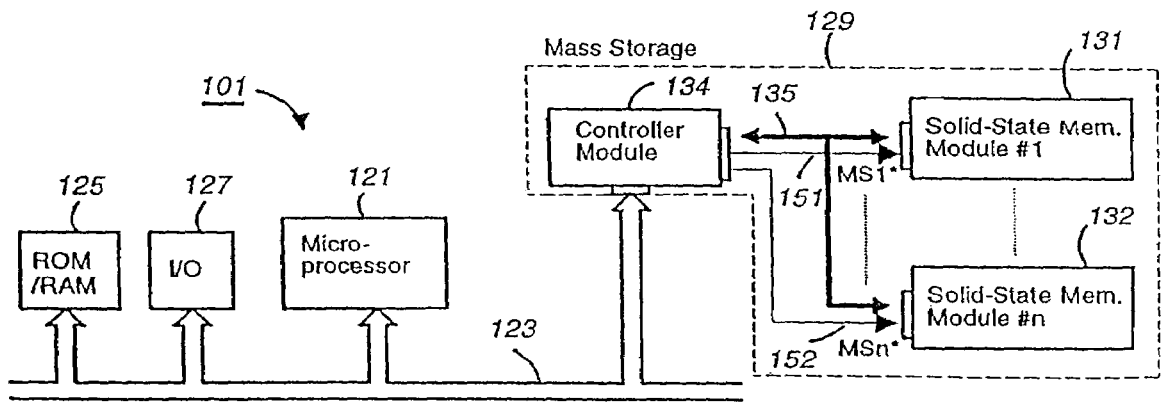
FIG. 1B is a general microprocessor system connecting connected directly via a system bus to a solid-state mass storage system according to another preferred embodiment of the present invention.

FIG. 1B illustrates an alternative embodiment in which the controller module 134 is connected directly to the system bus 123 of the computer system 101. In this embodiment, as will be described later, the controller module 134 is simplified as some of its functions are performed by the system microprocessor 121 and other system resources.

Solid-State Memory Module

Figure 2A:
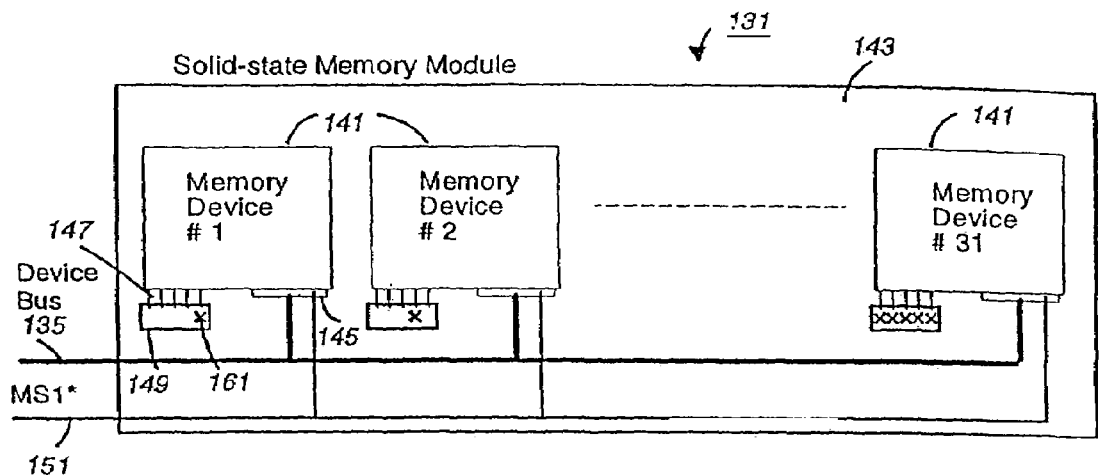
FIG. 2A illustrates schematically the solidstate memory module having arranged as an array of memory devices mounted on "keyed" mounts in a memory board backplane.

FIG. 2A illustrates schematically the solidstate memory module such as 131 or 132 of FIGS. 1A and 1B having arranged as an array of memory devices 141 mounted on a printed circuit memory board or a backplane 143. Each memory device 141 is an integrated circuit memory chip.

Each memory device 141 has two groups of external pads or pinouts. The first group is the device-bus pinouts 145 for connection to the device bus 135 on the backplane 143. In this way, the device bus 135 interconnects between all the memory devices 141 in the solid-state memory module 131 on the one hand, and the controller module 133 or 134 on the other hand (see FIGS. 1 and 21A-1B and 2A-2B).

The second group of external pads are device select pinouts 147 which are to be connected to corresponding pads of a mount 149 on the backplane 143. There is one such mount for each memory device so that the memory devices 141 are laid out in an array in the backplane 143.

As an example, a memory device 141 may have five device-select pinouts, which are connected to five corresponding pads on the mount 149. By selectively grounding certain pads, such as a pad 161 on the mount, each mount may be configured or "keyed" to designate a definite address of the array. With five pins, the number of groundable pad configurations or "keys" amounts to $2^5=32$ permutations. Thus in the preferred embodiment, the mounts in the array will have grounding configurations (11111), (11110), (11101), . . . , (00000), where "O" denote a pad that is grounded.

As will be discussed in connection with a device select circuit illustrated in FIGS. 4 and 5A, these keyed mounts are used to assign an array address to the memory device chip 141 mounted thereon. In this way each memory device chip can be addressed for selection or enablement.

Figure 2B:
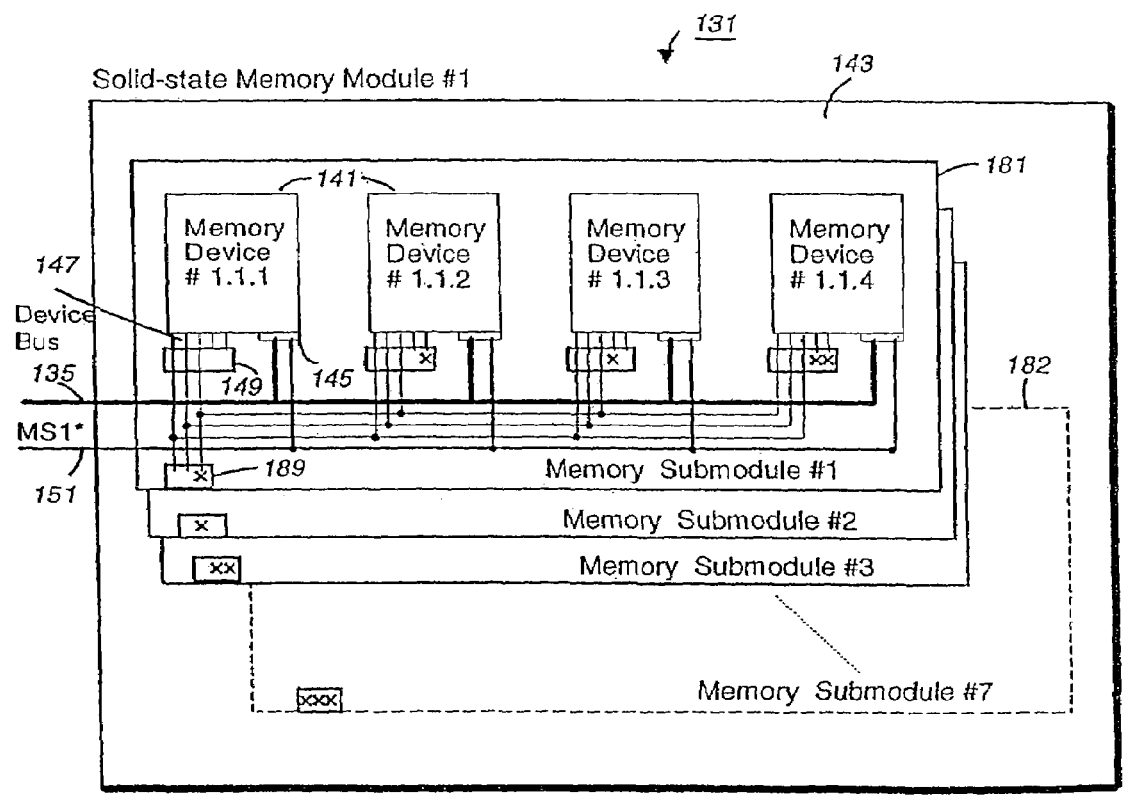
FIG. 2B illustrates schematically another memory partition module arrangement in which a plurality of memory submodules are being mounted on "keyed" mounts on the backplane of the solid-state memory module, and a plurality of memory devices is being mounted on "keyed" mounts on each memory submodule.

FIG. 2B illustrates schematically another memory partition module arrangement in which each memory module such as 131 may be further partitioned into a plurality of memory submodules such as 181, 182. This allows for more flexibility in memory configurations without the need to provide at the outset the full capacity of mounts for all possible memory devices 141 in the memory module's backplane 143. In this way, the backplane 143 needs only provide a reduced set of mounts and spaces for these submodules. Each submodule such as 181, 182 has a smaller group of memory devices 141 mounted on it and they are all enabled by the same module select signal MS1* 151.

Similar to the case illustrated in FIG. 2A, each memory device 141 is given an address on the memory submodule 181 by means of the grounding configuration of the multi-pin mount 149. However, with a reduced number the memory devices in a submodule, only a subset of the bits of the multi-pin mount is required. For example, with four memory devices 141 per submodule, only two bits of the multi-pin mount 149 need be configured to provide unique addresses on each submodule. The rest of the bits in the multi-pin mount 149 may be configured to provide unique addresses for the memory submodules such as 181, 182 on the backplane 143 of the memory module 131. For a 5-bit mount, two of the bits are configured for four memory-device addresses on each memory submodule, and the other three bits are configured for up to eight memory-submodule addresses on the memory module's backplane 143.

The memory submodules such as 181, 182 are each mounted on the memory module's backplane 143 with connections to the device bus 135 and to a submodule multi-pin mount 189. This mount 189 is a subset of a memory-device's multi-pin mount 149. For the example above, it will be a 3-pin mount.

According to another aspect of the invention, one particular "key" among the permutations of grounding configurations of the multi-bit mounts 149 is reserved as a "master select" which unconditionally allows each chip to be selected or enabled.

Figure 3:
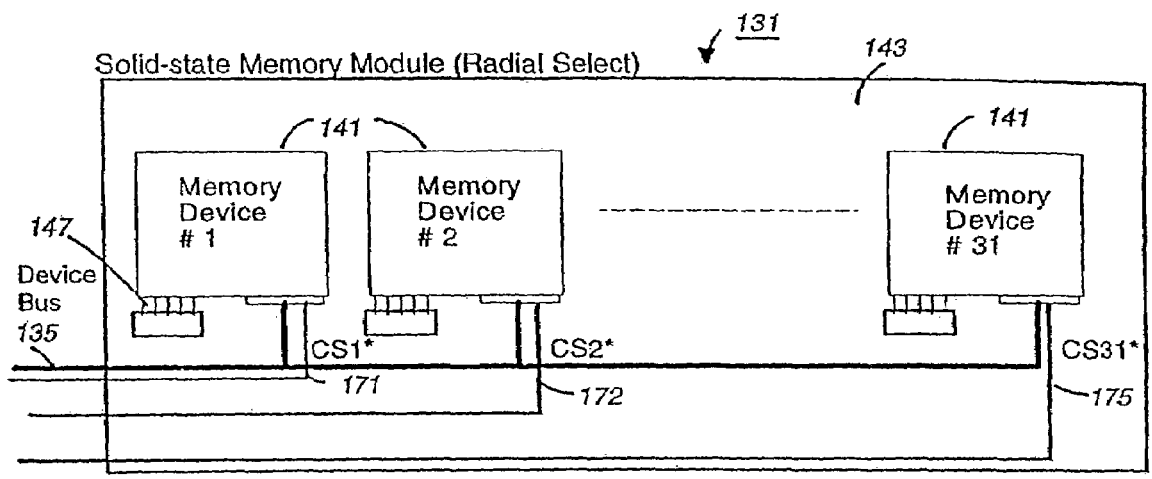
FIG. 3 illustrates a "radial select" configuration of the memory devices in FIG. 2 in which the mounts all have the master, all-bits-ungrounded "keys", and each memory devices device is selected by an individual chip select (CS*) signal.

FIG. 3 illustrates a radial select scheme, in which all the memory devices 141 in the solid-state memory module 131 can be enabled for selection by a "master-select" "master select" configuration. In the preferred embodiment, this "master select" is given by having all the bits of the mount not grounded. Thus, each mount 149 in the array has the same grounding configuration, namely (11111). Individual memory device devices within the solidstate memory module 131 is are selected by dedicated chip select signals such as CS1*, CS2*, CS31* as in the conventional case. These dedicated chip select signals are respectively carried in additional lines such as 171, 172, 175 among the device bus 135.

Flash EEPROM Memory Device

Examples of non-volatile, solid-state memory, integrated circuit chips include read-only-memory (ROM), electrically-programmable-read-only-memory (EPROM), electrically-erasable-programmable-read-only-memory (EEPROM), and flash EEPROM.

In the preferred embodiment, an array of flash electrically-erasable-programmable-read-only memories (EEPROM's) in the form of an integrated circuit chip is employed as the memory device 141. A flash EEPROM device is a non-volatile memory array which may be partitioned into one or more sectors. These sectors are addressable for wholesale electrical erasing of all memory cells therein. Various details of flash EEPROM cells and systems incorporating defect managements management have been disclosed in two related co-pending U.S. patent applications. They are U.S. patent applications, Ser. No. 508,273, filed Apr. 11, 1990, by Mehrotra et al., now U.S. Pat. No. 5,172,338 and Ser. No. 337,566, filed Apr. 13, 1989, by Harari et al., now abandoned, and Ser. No. 963,838, filed Oct. 20, 1992, by Harari et al, now U.S. Pat. No. 5,297,148 which is a divisional application of Ser. No. 337,566. Relevant portions of these two disclosures are hereby incorporated by reference.

Figures 4, 6C:
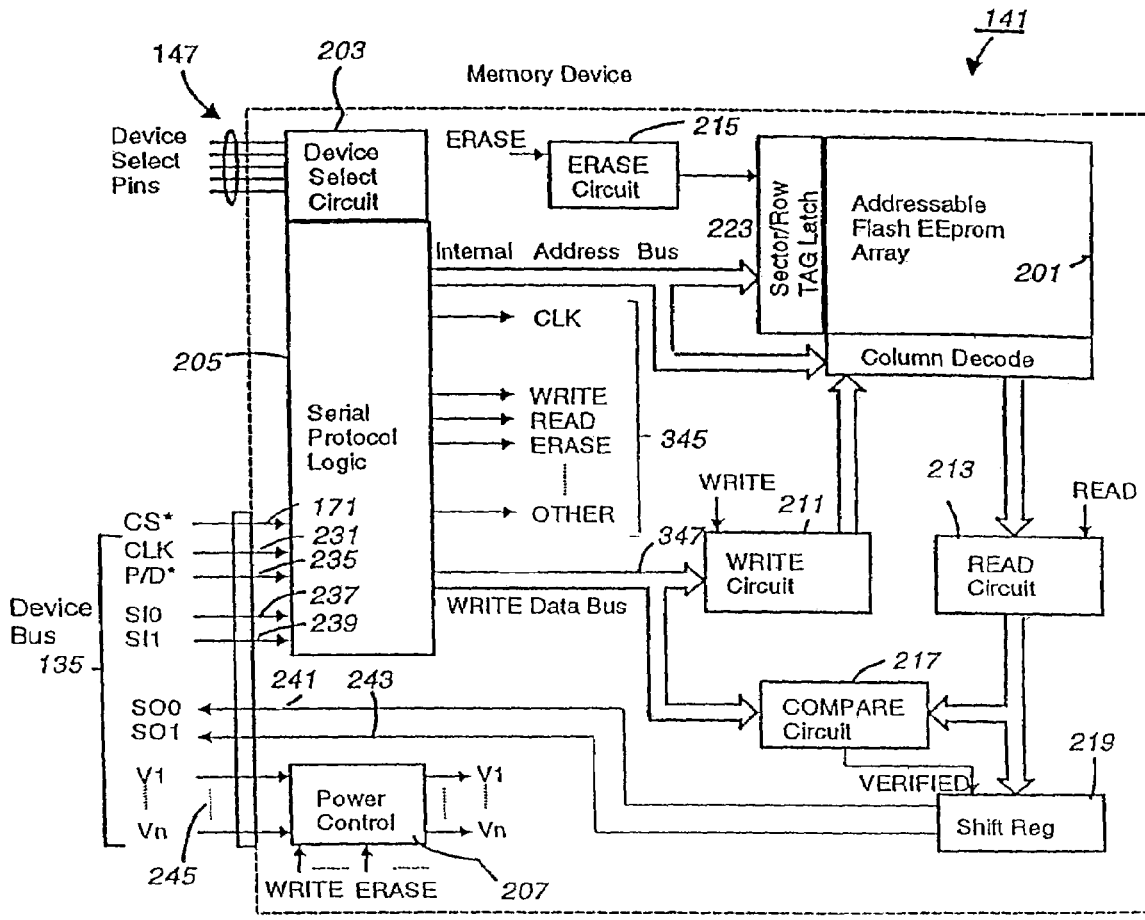
FIG. 4 is a schematic illustration of the functional blocks of a flash EEPROM memory device.
FIG. 6C shows the logic state of signals in the device select circuit shown in FIGS. 4-6.

FIG. 4 is a schematic illustration of the functional blocks of a flash EEPROM memory device. The flash EEPROM memory device 141 includes an addressable flash EEPROM cell array 201, a device select circuit 203, a serial protocol logic 205, a power control circuit 207, and various WRITE, READ, ERASE circuits compare and shift register 211, 213, 215, 217 and 219.

Serial Device Bus

One important feature of the present invention is to employ a serial link between each of the memory devices 141 and the controller module 133 or 134. The serial link carries serialized addresses, data and commands. This has several advantages in the present application. The serial link greatly reduces the number of interconnecting lines between the controller module 133 or 134 and each of the memory devices chip 141. Fewer signal lines requires fewer traces on the printed circuit memory boards or backplanes 143, resulting in dramatic savings in board space and overall system density improvements. Fewer pins are required. This applies both to memory card edge connectors and to individual memory device chip pinouts. The results of fewer pins are is lower costs and greater system reliability. Also fewer pinouts on a memory device results in a smaller device and consequently, lower device cost. Finally, expanding the memory capacity of the system is simply achieved by a higher packing density of devices on standard printed circuit boards. It is not necessary to have a variety of circuit boards for each density, since the number of address and chip select signals does not change with capacity when employing a serial link. By having a common serial interface, a controller can be designed to support memory devices of differing capacities without modifications to the system. In this way, future memory devices of different capacities can be connected to the same controller without hardware changes resulting in forward and backward compatibility between memory cards and controllers.

Still referring to FIG. 4, the flash EEPROM memory device 141 has two sets of external pins. The first set of external pins is for connection to the device bus 135. The device bus 135 includes a timing signal line, CLK 231, a control signal line P/D* 235, two serial-In's, SI0 237, SI1 239, two serial-Out's, S00 241, SO1 243, and a set of power lines V1 . . . Vn 245. Another control signal line, chip select CS* 171 is shown outside the device bus 135, although in some embodiments, it may be regarded as part of the device bus 135. The use of two serial-In's and two serial-Out's requires very few signal lines and yet still allow allows information to be transferred at adequate rates.

The second group of external pins consists of the five device-select pinouts 147 described in connection with FIGS. 2 and 3.

Device Select Scheme and Circuit

According to the present invention, any memory device 141 among the array of memory devices mounted on the backplane 143 may be enabled such that the device is selected whenever the CS* 171 (chip select) is asserted. In particular, each device may be enabled in one of two ways.

The first is "master-select" "master select" by means of a special grounding configuration of the device select pins 147, as described earlier in connection with FIG. 3. One particular "key" among the permutations of grounding configurations of the multi-bit mounts 149 (see FIG. 3) is reserved as a "master select" which unconditionally allows each chip to be selected or enabled. This allows a group of chips with this "master select" mount to be selected together (see FIG. 3A) or allows for radial selection of individual devices (see FIG. 3B).

The second is "address-select" by shifting in an address that matches the one defined by the device select pins 147 from the serial lines SIO 237, SI1 239. As described in connection with FIGS. 2 and 3, the address for each location in the array is defined by the grounding configuration or "key" of the mount 149 thereat. By virtue of the memory device connecting being connected to the mount 149, the address defined by the mount is passed onto the memory device 141. Whenever a memory device 141 is to be selected, its array address is made available on the device bus 135. A device select circuit in each memory device 141 compares the array address obtained from the device bus to that obtained from the device select pinouts 147.

According to yet another aspect of the invention, an "address-deselect" "address deselect" scheme is employed in which a special address or code can be shifted in to deselect devices that have previously been selected. In the preferred embodiment, the special deselect code is (11111).

Figure 5A:
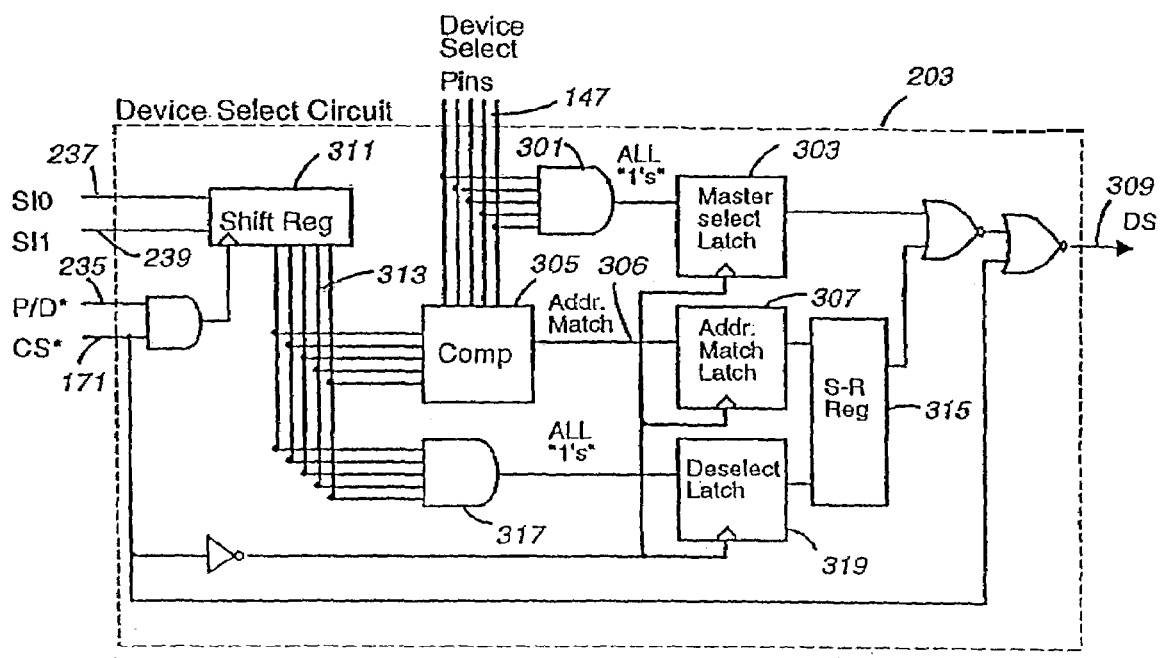
FIG. 5A shows one embodiment of the device select circuit within the memory device illustrated in FIG. 4.

Table 1 summaries FIG. 6C summarizes the logic states of signal of the device select circuit 203 which appears in FIGS. 4-6. The device select circuit has inputs from the device select pins 147 and the device bus 135, and has an output DS 309 (see FIG. 5A) to select or deselect the device it is controlling.

FIG. 5A shows one embodiment of the device select circuit 203 incorporating the "master-select" "master select", "address-select" "address select", and "address-deselect" "address-deselect" features. The circuit 203 has inputs SI0 237, SI1 239, and the two control lines CS* 171, P/D* 235 from the device bus 135. In the present example, the array address of the memory device 141 in FIG. 4 is defined by a 5-bit address. This 5-bit address is set by the mount 149 and communicated to the device select circuit 203 via the device select pinouts 147.

The master-select master select feature is implemented by the 5-input AND gate 301. When a pin configuration of (11111) appears, the HIGH output of the AND gate 301 is latched by a master-select master select latch 303. This in turn results in DS 309 becoming HIGH when the chip select CS* in line 171 is low, as shown on FIG. 5A.

Device selection by address-matching is implemented by a comparator 305 and an address-match latch 307. In order to enable a particular memory device 141, the same address for that device must be obtained from the serial-in lines 237, 239 of the device bus 135. In the present embodiment, a 5-bit array address is shifted into a shift register 311 from the serial-in lines SI0 237, SI1 239. The clocking signal is carried in by the control line P/D* 235 which is gate-enabled by a HIGH signal in the master chip select line CS* 171. The 5-bit array address is then passed from the shift register 311 via the bus 313 to the comparator 305. The comparator 305 compares this address with that obtained from the device-select pinouts 147. The comparator output 306 goes HIGH whenever the addresses match. This output is clocked into the address-match register 307 by the falling edge of CS* 171. This results in a S-R register 315 being set HIGH such that DS 309 is also HIGH and the device is selected. On the other hand, when the addresses do not match, DS 309 will be LOW and the device is not selected.

Device deselection by "address-deselect" "address deselect" which is implemented by a special deselect code e.g., (11111) is used to signal global deselection. A second 5-input AND gate 317 looks for a data pattern of all one's being shifted into the shift register 311. When a match occurs and also the chip select CS* in the line 171 is activated goes from HIGH to LOW (see FIG. 5B), the comparator 317 outputs a deselect signal which is latched by a deselect latch 319. This in turn is used to reset the S-R register 315 on all devices previously selected. By shifting in the (11111) pattern and activating the CS* signal, all devices that are presently selected will see the deselect pattern and will be deselected.

Figure 5B:
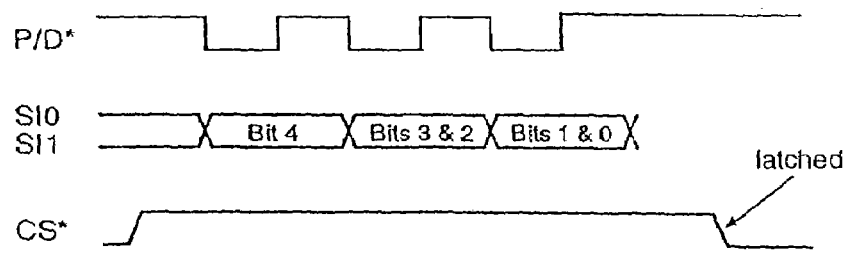
FIG. 5B is a timing diagram for the device select circuit of FIG. 5A.

FIG. 5B is a timing diagram for the device select circuit of FIG. 5A. First, the CS* signal goes high and the timing signal in P/D* at half the CLK rate is used to clock the serial address from SI0 and SI1 into the shift register 301. After three P/D* clock periods, 6 bits have been loaded into the shift register 301 and only the least significant 5 bits are used by the comparator 303. The trailing edge of CS* is used to load the various latches 303, 307, 319.

Serial Protocol and Device

After a memory device 141 (see FIGS. 2, 3, 4) has been addressed and enabled, read or write operations may be performed on it. A stream of serialized addresses, data and commands is then passed between the controller module 133 or 134 (see FIGS. 1A and 1B) and the enabled memory device 141 via the device bus 135. From the memory device end, a serial protocol logic is used to sort out, re-organize and re-route the various information in the serial stream to their appropriate destinations.

Figure 6A:
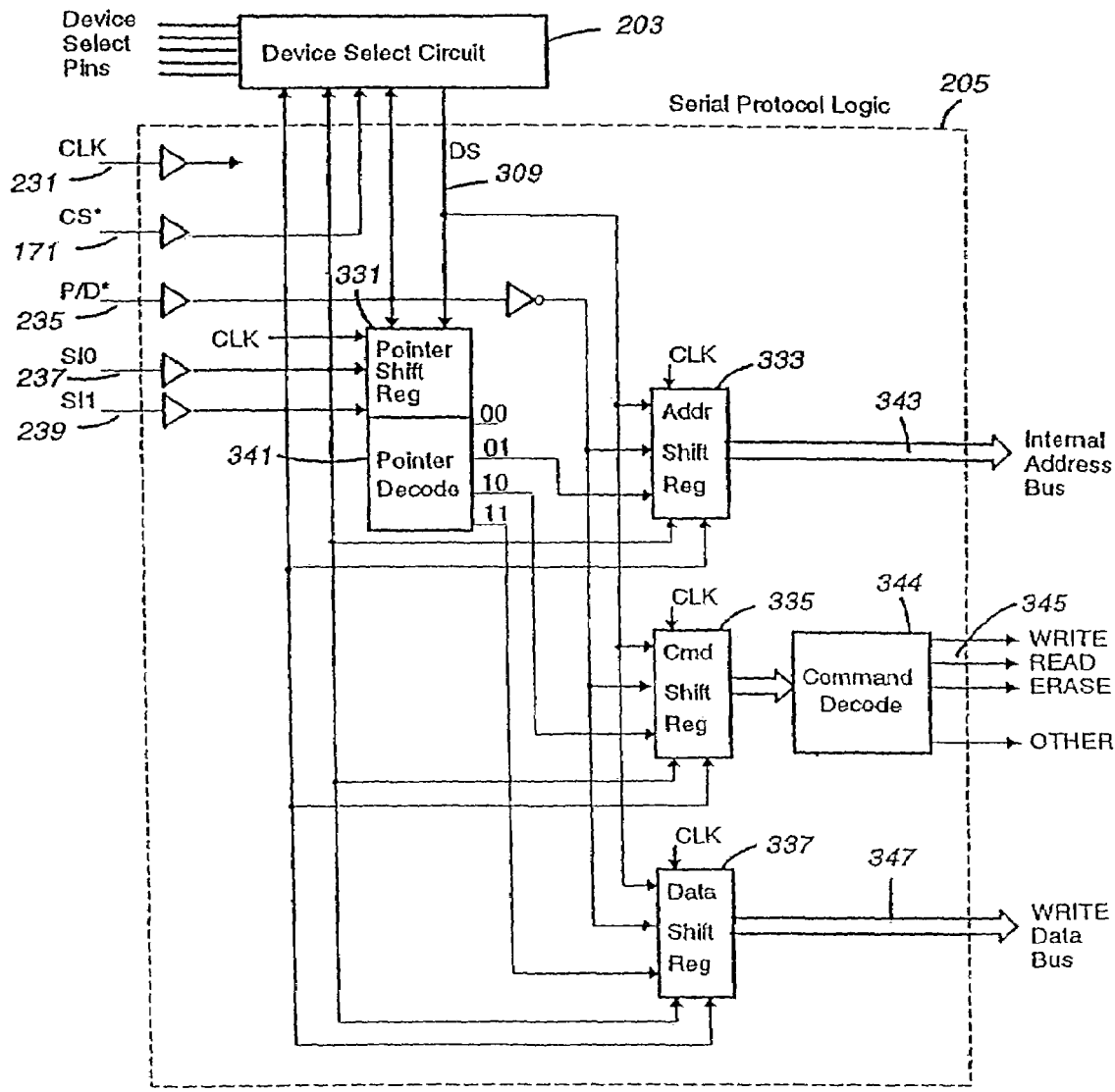
FIG. 6A is one embodiment of the serial protocol logic within the memory device illustrated in FIG. 4.

FIG. 6A is one embodiment of the serial protocol logic in the memory device 141 illustrated in FIG. 4. The serial protocol logic 205 receives inputs from the device bus 135. They are clock signals from the CLK 231 line, control signals from CS* 171, P/D* 235 and serial-in lines SI0 237, SI1 239. The serial protocol logic 205 essentially sorts out the serialized stream of addresses, data and commands from the serial lines SI0 237 and SI1 239. It then re-routes each type of information before converting some of them into parallel forms for output.

A pointer shift register 331 and a pointer decode 341 are used to direct the non-pointer information in the serial lines SI0 237, SI1 239 to either an address shift register 333, or to a command shift register 335 or to a data shift register 337.

In the preferred embodiment, the address shift register 333, when enabled, shifts the 2-bit stream from the serial lines SI0, SI1 out to an 18-bit internal address bus 343. Similarly, the command shift register 335 shifts out a parallel command vector which is further decoded by a command decode 344 into a number of control signals such as WRITE, READ, ERASE, . . . , and OTHER carried by control lines 345. Similarly, the data shift register 337 shifts in a 64-bit chunk of data, and outputs it in parallel on a WRITE data bus 347.

The pointer shift register 331 is first enabled to receive the routing information. After the routing information is received, the pointer shift register 331 is disabled. The routing information received is decoded by the pointer decode 341 to selectively enable one of the three shift registers 333, 335, 337. Timing and control is provided by the P/D* line 235. One state (HIGH) of P/D* 235 is used to enable the pointer shift register 331 and disable the shift registers 333, 335 and 337. The other state (LOW) of P/D* 235 is used to disable the pointer shift register 331 and enable the shift registers 333, 335 and 337.

The operation of the serial protocol logic 205 illustrated in FIG. 6A is best understood with reference to its timing diagrams.

Figure 6B:
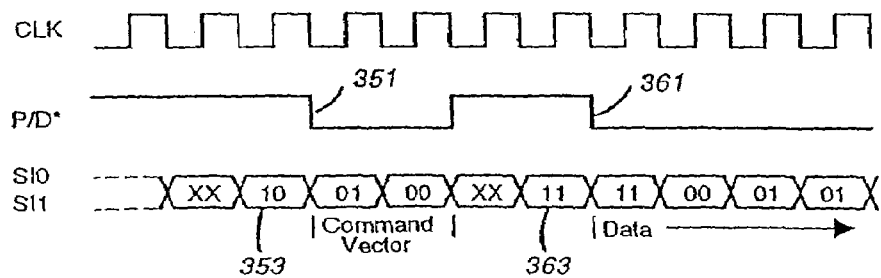
FIG. 6B is a timing diagram for the serial protocol logic of FIG. 6A.

FIG. 6B is the corresponding timing diagrams for the operations of the serial protocol logic. When P/D* 235 is HIGH, the shift registers 333, 335 and 337 are disabled. A stream of 2-bit codes from the two serial lines SI0, SI1 are clocked into the pointer shift register 331 at the rising edge of each clock period. Each of these 2-bit codes is used to select and point to one of the shift registers 333, 335 and 337.

For example, as shown in FIG. 6A, the 2-bit code "00" is reserved for future use. Code "01" points to the address shift register 333. Code "10" points to the command shift register 335. Code "11" points to the data shift register 337. The protocol is such that when P/D* 235 goes LOW, the falling edge is used to load the last 2-bit code in the pointer shift register 331 to the pointer decode 341. In FIG. 6B, for the P/D* signal, the first falling edge shown (351) loads the code "10" (353) from the pointer shift register 331 to the pointer decode 341. This means the command shift register 335 is pointed to and is selected.

After P/D* line 235 goes LOW, the pointer shift register is disabled and the information from the serial lines SI0, SI1 are is shifted into the enabled command shift register 335 and interpreted as a command vector. The shifting ends when the P/D* line 235 goes HIGH again.

Thereafter, the pointer shift register 331 is again enabled to receive information from the serial lines SI0, SI1. In the example shown in FIG. 6B, for the P/D* signal, the second falling edge shown (361) latches the code "11" (363) into the pointer shift register 331. This means the data shift register 337 is now pointed to and is selected. Once again, the pointer shift register 331 is disabled and the information from the serial lines SI0, SI1 are now shifted into the enabled data shift register 337 and interpreted as data. The shifting ends when the P/D* line 235 goes HIGH again.

Controller Module

Referring again to FIGS. 1A and 1B, having described the solid-state memory module 131 with respect to the serially linked device bus 135, attention is now directed to the controller module 133 or 134.

Figure 7A:
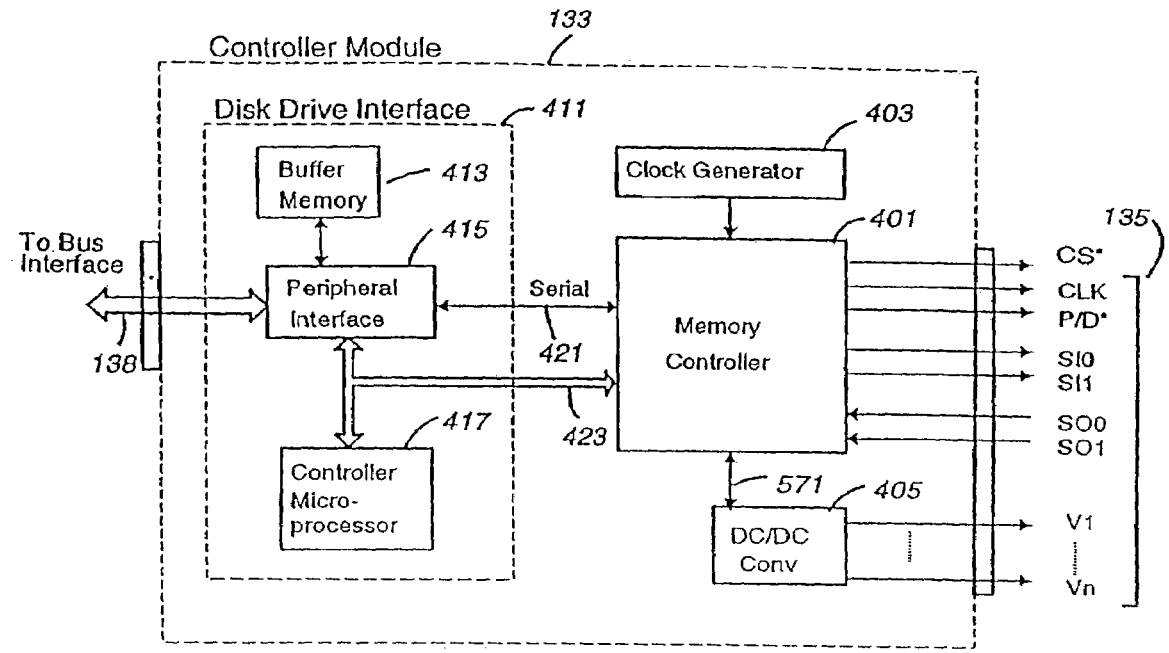
FIG. 7A is a schematic illustration of the functional blocks of the controller module illustrated in FIG. 1A.

FIG. 7A is a schematic illustration of the functional blocks of the controller module illustrated in FIG. 1A. The controller module 133 contains essentially a memory controller 401 which manages the information flow between the solid-state memory module 131 and the disk drive interface 411. It also sequences various control signals for the operation of the memory devices 141. The memory controller 401 receives timing clock signals from a clock generator 403. It also controls the output of various voltages required for the operations of the memory device 141 by means of a power supply or converter 405. The device bus 135 links the memory controller 401 and the power supply converter 405 to the memory device 141.

In the preferred embodiment, a standard disk drive interface 411 is implemented between the memory controller 401 and the computer system bus 123. In this way, to the computer system 101, the controller module 133 and therefore the mass storage 129 behaves as if it is were a disk drive system. This allows hardware and software compatibility when the present solid-state memory system is used to substitute for a disk drive system.

The standard disk drive interface 411 typically includes a buffer memory 413, a peripheral interface 415 and a controller microprocessor 417. The buffer memory 413 is essentially a static RAM, and it temporarily holds data that is to be written or that has just been read. The peripheral interface 415 may be implemented by a commercially available integrated-circuit chip such as the SH 265 Disk controller by Cirrus Logic Inc., Milpitas, California. The peripheral interface 415 exchanges data with the memory controller 401 via a data serial line 421. The controller microprocessor 417 may be implemented by a commercially available integrated circuit chip such as the 68HC11 microprocessor by Motorola Inc., Phoenix, Ariz. A controller address and control bus 423 also interconnects the peripheral interface 415, the memory controller 401 and the controller microprocessor 417.

Figure 7B:
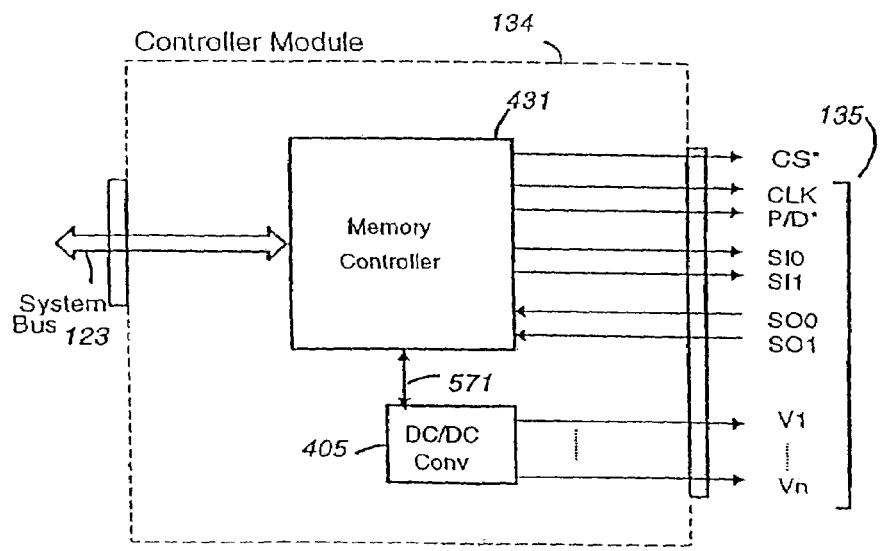
FIG. 7B is a schematic illustration of the functional blocks of the alternative controller module illustrated in FIG. 1B.

FIG. 7B is a schematic illustration of the functional blocks of the alternative controller module illustrated in FIG. 1B. The controller module 134 contains essentially a memory controller 431 and a power converter 405. The memory controller 431 manages the information flow between the solid-state memory module 131 and the computer system 101. It also sequences various control signals for the operation of the memory devices 141. Unlike the controller module 133 of FIG. 7A, some of the controller module's functions are performed by the system microprocessor 121 and other system resources of the computer system 101 (see FIG. 1B). The memory controller 431 is in direct communication with the system microprocessor 121 via the microprocessor bus 137 system bus 123. Similarly to the memory controller 401, it also controls the output of various voltages required for the operations of the memory device 141 by means of a power supply or converter 405. The device bus 135 links the memory controller 431 and the power supply 405 to the memory devices 141.

Figure 8A:
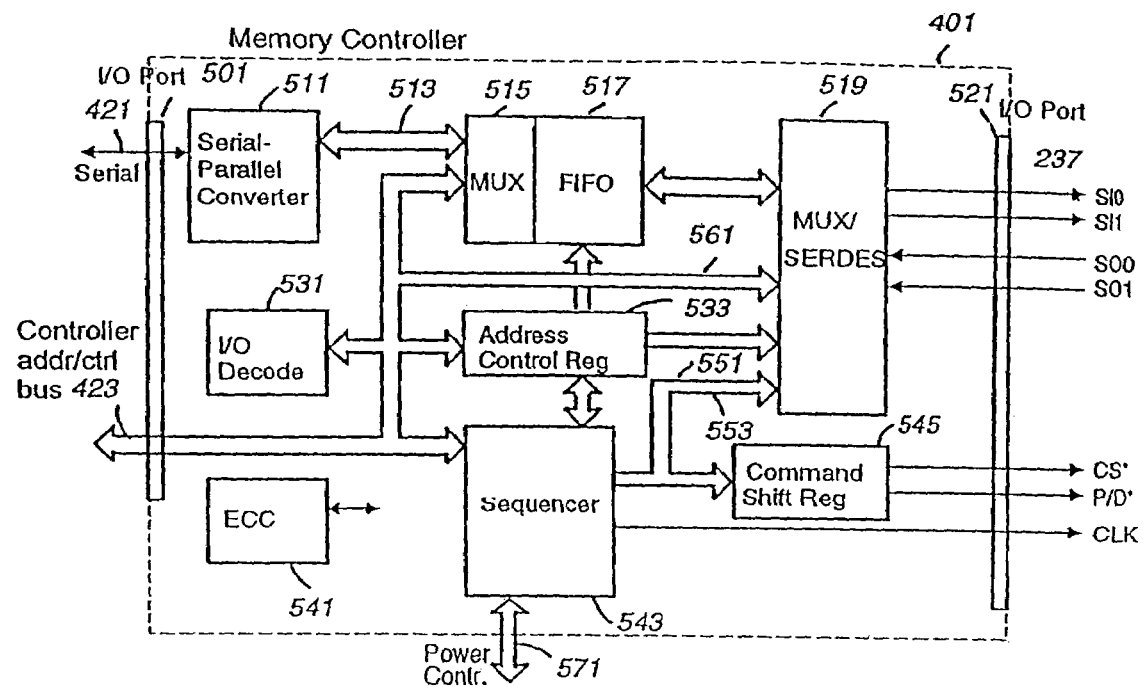
FIG. 8A is a schematic illustration of the functional blocks of the memory controller illustrated in FIG. 7A.

FIG. 8A is a schematic illustration of the functional blocks of the memory controller 401 illustrated in FIG. 7A. As described above, the memory controller 401 is linked to the disk drive interface 411 by means of a serial data line 421 and a controller address and control bus 423. Tracing the data path from the disk drive interface 411 side, the serial data line 421 enters through an I/O port 501 and is converted by a serial/parallel device serial-parallel converter (SERDES) 511 to an 8-bit parallel bus. It is then switched by a MUX 515 into a FIFO 517 before being serialized and switched out by a MUX/SERDES 519 to an I/O port 521 as the 2-bit serial-in bus SI0, SI1. On the other hand, the data path from the device bus 135 side has the 2-bit serial-out bus SO0, SO1 tracing a reverse path along the same functional blocks.

The memory controller 401 also has an I/O decode (e.g. register strobe/enable decodes) 531, address control registers 533, a an error correction code (ECC) hardware 541, a sequencer 543, and a command shift register 545. Addresses and control signals are carried along the controller address and control bus 423. The bus enters through the I/O port 501 and lines therein interconnect the various functional blocks as shown in FIG. 8A. The ECC hardware 541 is used to check and correct errors that may arise in the data (connections not explicitly shown).

In order to describe the operation of the memory controller 401 in relation to the computer system 101, the controller module 133 and the memory module 131, references are also made to FIGS. 1A, 2 and 7A.

To initiate the reading or writing of a memory device 141, the system microprocessor 121 initializes internal registers (e.g. address control registers 533) and the sequencer 543 for operation. When a command and accompanying address are received from the host computer system 101 via the peripheral interface 415, the controller microprocessor 417 evaluates the command and translates that command and address to a memory device address and command sequence. The memory device's address is loaded into the address control registers 533 in the memory controller 401. The microprocessor then activates the desired sequence by writing a command vector to the sequencer. This command vector will cause the sequencer to jump to the address value loaded and start executing the code at that address.

For a read command, the microprocessor receives a command over the host interface via the peripheral interface 415 of the controller module 133. It evaluates this command and translates the address to a memory device address. The microprocessor then loads this address into the address control registers 533. The microprocessor then loads the sequencer 543 with the starting address of the read sequence. The sequence starts executing code at this address. The sequencer 543 first shifts out the select address for selecting a particular memory device chip 141, followed by an address of a memory chunk (e.g. 64 bits) address from the address control registers through the lines 551 via the MUX/SERDES 519 to the serial-in lines SI0, SI1. The sequencer then puts out a read command and switches the MUX/SERDES 519 to receive it via the lines 553. The read command is shifted out to the serial-in lines SI0, SI1. In the meantime, the sequencer 543 is putting out the control signals CS* and P/D* through the command shift registers 545.

Once the read is started the sequencer 543 enables the FIFO 517 to accept incoming data read from the memory device 141. This data is received into registers in the I/O port 521 and converted to parallel data in the MUX/SERDES 519 before being put into the FIFo 517. At the same time the FIFO 517 is enabled to load data, the ECC hardware 541 is activated and starts calculating on the data loaded into the FIFO. The sequencer 543 looks at a FIFO RDY line (not explicitly shown) to see if a byte of data is ready to be sent to the peripheral interface 415 of the disk drive interface 411. When the FIFO 517 is ready, the sequencer 543 signals the peripheral interface 415 to receive the data and then transmits the data from the FIFO 517 via the SERDES 511 out to the serial line 421.

In the preferred embodiment, data is written and read in 64-bit chunks. After one chunk of data is read, the sequencer 543 then updates the address control register 533 (chunk counter) and shifts out the address for the next chunk to be read. While reading data from memory, the controller will output the address for the next chunk to be read at the same time it is receiving the read data from the present chunk. The controller supports overlapping operations to give a continuous flow of data. This sequence continues until the last data chunk is read as signaled by the address control registers 533 to the sequencer 543. While data is being received from the memory device 141, it is being gated by the sequencer 543 into the ECC hardware for error checking. The status of the ECC check as to whether data was received correctly is then posted to the controller microprocessor 417. After this, the sequencer 543 checks to see if the FIFO 517 has been emptied, and if so, shuts the I/O ports 501, 521 off and gates to an idle state, waiting for a new command.

The controller microprocessor 417 of the disk drive interface 411 has a direct path for reading and writing data to and from the memory device 141 via the controller address and control bus 423 and 561 and the MUX/SERDES 519. This is done to support reading of header information in memory sectors and header reads, formatting and diagnostics of the memory device.

For a write command, the controller microprocessor 417 of the disk drive interface 411 in the controller module 133 receives a command over the bus interface 138 via the peripheral interface 415 (see also FIGS. 1a, 7a). When the sequencer 543 receive a write vector it will signal and drive an input on the peripheral interface 415 of the disk drive interface 411. The peripheral interface 415 will then initiate the sequencer 543 to have serial data received over the serial line 421. The data received by the SERDES serial-parallel converter 511 is put in parallel format and written into the FIFO 517 via the MUX 515.

The addressing of a particular memory device chip and a memory chunk therein is similar to that described for the read operation. While the FIFO 517 is being filled the sequencer 543 has gated the address loaded in the address control registers 533 to the memory device, including the device chip select address. After a memory device chip is selected and the memory device address is loaded, the sequencer will look at a FIFO RDY line (not explicitly shown) to see if a byte of data is ready to be sent to the memory device 141 via the device bus 135. When the FIFO 517 is ready, the sequencer 543 switches the MUX/SERDES 519 from the address control registers 533 to the FIFO 517 to receive data instead. The sequencer gates out data in 64-bit chunks chunk of data, received a byte at a time from the FIFO, and transmits the data via the SERDES/MUX 519 and I/O port 521 out to the Serial-out lines SOO, SO1 of the device bus 135. The sequencer 543 then switches the MUX/SERDES 519 again to shift out the required command vectors via the bus 553 to the Serial-in lines SIO, SI1.

After the address, command and data have been loaded into the memory device 141, the sequencer will activate the power converter 405 of the controller module 133 by loading the proper values in the power control I/O port registers (not explicitly shown) via a bus 571. The output outputs of these registers drive the inputs to the power converter 405 providing the required voltages for the programming (or writing) of the memory device. These output lines also turn on any programming reference current out of the power converter 405.

In addition, the sequencer 543 handles the control interface to the memory device 141 by outputting control signals CS*, P/D* via the command shift registers 545. Also, the sequencer keeps track of the write time and at the end of it, halts programming by lowering the programming voltage from the power converter 405.

In the preferred embodiment, a 64-bit chunk of data is programmed at a time. After a chunk of data is programmed, the sequencer will then issue a pulse to the address control registers 533 updating the chunk address. It then repeats the sequence for the next chunk to be programmed.

While the data is being gated to the memory device 141, it is also being sent to the ECC hardware 541. After the sequencer has sent the last chunk of data it turns the FIFO 517 off and enables the check bytes in the ECC hardware 541 to be written to the memory device 141. Thereafter, the sequencer is done and returns to the idle state until a new command from the controller microprocessor 417 from the disk drive interface arrives to activate it.

A memory controller incorporating defect management and a write cache for flash EEPROM devices has been disclosed in U.S. patent application Serial No. 337,566, filed Apr. 13, 1989, by Harari et al., now abandoned. The relevant portions of the disclosure from that application are hereby incorporated by reference.

Figure 8B:
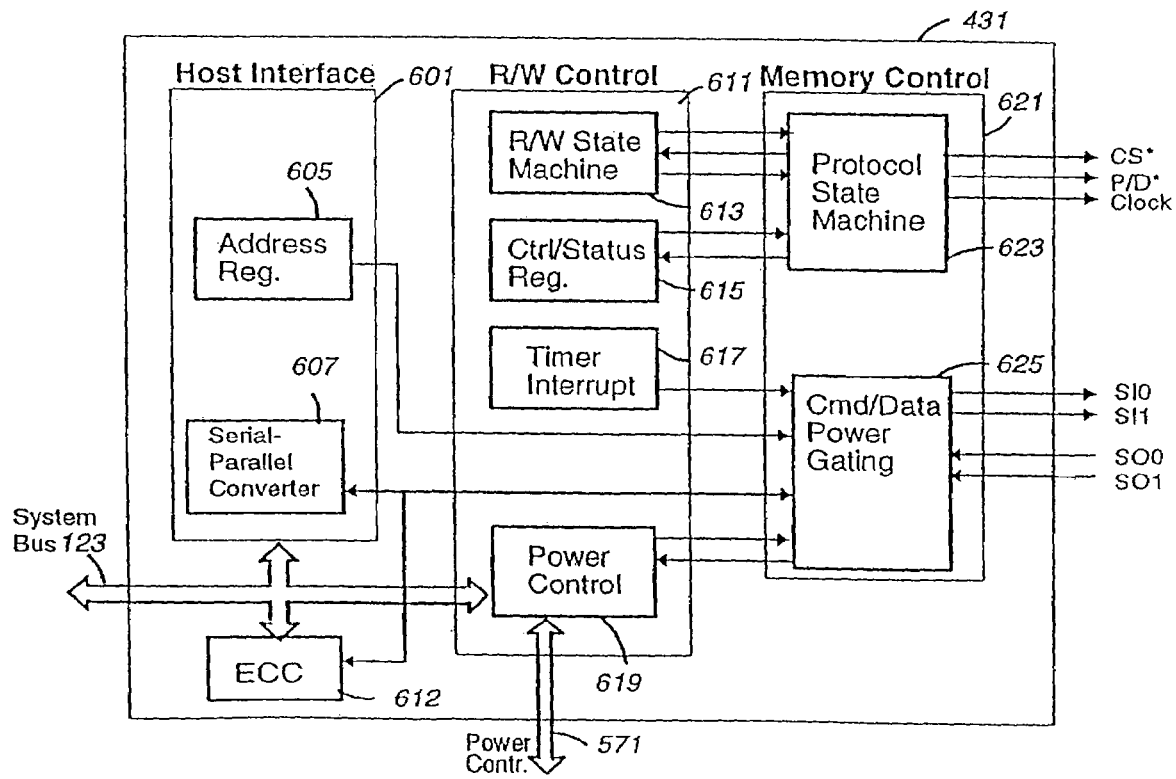
FIG. 8B is a schematic illustration of the functional blocks of the memory controller illustrated in FIG. 7B.

FIG. 8B is a schematic illustration of the functional blocks of the alternative memory controller 431 illustrated in FIG. 7B. A key feature of this architecture is to have the data that is read or written to be accessed by a host interface 601 used to set up the control. Unlike the embodiment shown in FIG. 8A, this memory controller 431 interfaces directly with the system bus 123 and does not have a bus interface 137 nor a disk drive interface 411 inserted therebetween (see FIG. 1B). Tight interaction with the host microprocessor 121 is required.

The host interface 601 is connected directly to the system bus 123. It includes an address registers 605 and a serial/parallel serial-parallel converter (SERDES) 607.

The memory controller 431 also includes a read/write control block 611 connected in between the host interface 601 and a memory control block 621. Error correction is performed by an ECC hardware 612 The read/write (R/W) control block 611 further includes a R/W state machine 613, control/status registers 615, a timer interrupt 617, and a power control 619. The memory control block 621 further includes a memory protocol state machine 623 and a command/data power gating control 625. The gating control 625 is for gating commands, addresses, data, and also a programming reference current into the device bus 135 (see also FIG. 7B).

The design of the memory controller 431 is based on the two state machines 613 and 623 to handle the hardware control. The read/write (R/W) state machine 613 handles the high level details of the operations, while the low level protocol state machine 623 is used to handle the details of the memory-device interface with the memory device.

To initiate a write sequence to the memory device 141, the host microprocessor 121 through the host interface 601 writes the desired starting address into the address registers 605. The microprocessor also writes the control/status registers 615 with the code for a particular group of memory devices that is to be turned on for this command. In one embodiment, the SERDES serial-parallel converter 607 also contains memory that allows an entire block of data to be buffered up between the host and the memory device 141.

The microprocessor 121 then writes the R/W state machine 613 with a vector for a write command. The R/W state machine 613 selects the address registers 605 as the data source and enables the protocol state machine 623 to begin. Then the protocol state machine 623 serially selects the desired memory device chip and shifts in the desired memory cell address. The protocol state machine 623 also outputs the proper command and starts the shifting of the write data to the memory device. This is done by taking the data out of the SERDES serial-parallel converter 607 in a serial manner and directing it through the memory control block 621 for shifting to be transferred to the memory device.

As data is shifted to the memory device the system microprocessor 121 continues to load data into the SERDES serial-parallel converter 607 keeping data ready to be shifted to the memory device. As data is being pulled out of the SERDES serial-parallel converter 607 it is also input to the ECC hardware 612 where the clock bits are being generated.

When a chunk of data (64 bits) has been shifted to the memory device, the protocol state machine 623 stops sending data and activates the high programming voltages by setting the proper control bits in the power gating of gating control 625 and power control 619. This in turn drives the power converter 405 of the controller module 134 to output the proper voltages as enabling the programming reference current via serial-in SI0 237.

The programming voltages and programming reference current are turned on for a specified duration by the protocol state machine 623 and the sequence is repeated for the next chunk. If data written to the memory device is the last chunk, the ECC hardware 612 is enabled and its data is written to the memory device via the device bus 135 by the normal chunk programming operations.

During the write sequence, status bits from the status registers 605 are available to the host microprocessor 121. Example Examples of such status bits are data ready/empty, ECC errors etc.

The read sequence is much like that of write with the flow of data reversed. The microprocessor 121 loads the starting address into the address registers 605. It then selects the desired group of memory devices by writing the code for them into the control/status registers 615. The microprocessor then issues the read command to the R/W state machine 613. It then activates the protocol state machine 623 which shifts out the address of the memory device, causing the proper chip to be serially selected and the starting address to be loaded into the memory device. The protocol state machine 623 also shifts out the read command to the selected memory device and also outputs appropriate control signals (e.g. P/D*) to the control lines in the device bus 135. The read serial data received from the memory device is then directed by the gating control 625 to the SERDES serial-parallel converter 607 logic as well as the ECC hardware 612. The microprocessor 121 then polls a status bit in the status registers 605 to see if a word of data is compiled in the SERDES serial-parallel converter 607. When this bit goes active by the proper number of bits being loaded, the microprocessor 121 reads the data from the SERDES serial-parallel converter 607 and stores it in the host memory 125. Thus a word of read data at a time is transferred to the host computer system 101. The controller will output the next address and perform the access delay for the next chunk at the same time the present chunk is being input. This allows for overlapping of access times to get a continuous stream of read bits. This continues until the last data bytes are loaded into the SERDES serial-parallel converter 607. In that event, the ECC bytes are fetched from the ECC hardware 612 and compared with the value recorded in the memory's sectormemory device. If an error occurs, a correction of the data will be attempted. If no error has occurred the R/W controller halts, stopping the protocol state machine 623, and waits for a new command to be entered.

Read Streaming

An important feature of the present invention as described above is the ability to perform a read streaming function between the memory devices 141 and the controller module 133 or 134 (see FIGS. 1A and 1B). Referring to FIGS. 4, 8A and 8B, the memory device 141 supports read streaming by latching the 64 bits (chunk) of parallel information of a read cycle into a holding shift register 219 to be shifted out as a serial stream.

Figure 9:
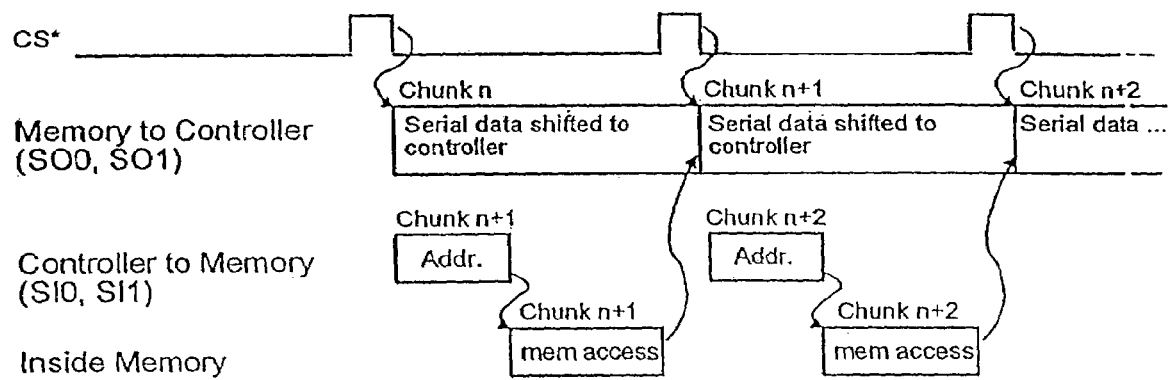
FIG. 9 is a timing diagram for the read streaming scheme, according to a preferred embodiment of the present invention.

The timing diagram for read streaming is illustrated in FIG. 9, which is to be referred to in conjunction with FIGS. 4, 8A and 8B. At the falling edge of the module select signal MS* (not shown in FIG. 9), the current (nth) chunk (64 bits) of data is read out and is then shifted to the controller module 133 or 134. At the controller module, the data is put in deserialized form and stored to be sent over the host interface. While the current (nth) chunk of data is being shifted out to the controller module, the memory controller 401 or 431 also updates the address for the next ((n+1)th) chunk of data to be read, and sends it to the memory device 141. This address is then used to access the memory device for the next ((n+1)th) chunk of data while the current (nth) chunk of data is still being shifted out. When the last pair of bits of the current chunk has been shifted out, the next 64 bits of data are already available at the outputs of the 64 sense amplifiers (not shown) of the read circuit 213. This information can then be transferred to the 64 bit serial out shift register 219 without the usual memory access delay.

This read streaming sequence is repeated until all data desired by the memory controller 401 or 431 has been fetched from the memory device 141. By performing reads in this pipeline manner, overall system performance can be improved and the serial data stream is made to look like a continuous bit stream. In contrast, typical memory structures do not have read out time overlapping with address and access times.

While the embodiments of the various aspects of the present invention that have been described are the preferred implementation, those skilled in the art will understand that variation variations thereof may also be possible. Therefore, the invention is entitled to protection within the full scope of the appended claims.

It is claimed:

1. A nonvolatile memory system comprising:
a nonvolatile memory including a plurality of nonvolatile memory cells and a shift register; and
a control device coupled to said nonvolatile memory, wherein said control device is enabled to receive data from outside of said nonvolatile memory system and to apply said data to said nonvolatile memory,
wherein said nonvolatile memory is enabled to operate a program operation,
wherein in said program operation, said nonvolatile memory receives said data from said control device, stores said data to said shift register and stores said data in said shift register to ones of said nonvolatile memory cells,
wherein said control device is enabled to receive data from outside of said nonvolatile memory system, while said nonvolatile memory is operating in said program operation, and
wherein said shift register has a data storing capacity enabling the transfer of a unit of data of a length equal to the data length of said data to be stored at one time of said program operation, said data length being more than 1 byte.

2. A nonvolatile memory system according to claim 1, wherein said nonvolatile memory includes a plurality of word lines and a plurality of data lines, and wherein each of said nonvolatile memory cells is arranged at a crossing point of a corresponding one of said word lines and a corresponding one of said data lines and is coupled to the corresponding word line and corresponding data line.

3. A nonvolatile memory system according to claim 2, wherein said nonvolatile memory includes a plurality of sectors each comprising one word line and ones of the nonvolatile memory cells coupled thereto, and wherein said shift register has a data storing capacity enabling the receiving of a unit of data of a length equal to the data storing capacity and enabling the storing of a unit of data in said sector.

4. A nonvolatile memory system according to claim 3, wherein said nonvolatile memory is a flash memory.

5. A nonvolatile memory system according to claim 1, wherein said control device includes a host interface comprised of a data bus transceiver, an address bus driver, an address decoder and a control bus controller, to enable communication between the nonvolatile memory and an external system bus.

6. A nonvolatile memory system comprising:

a plurality of nonvolatile memories each including a plurality of nonvolatile memory cells and a shift register; and a control device coupled to said nonvolatile memories, wherein said control device is enabled to receive data from outside of said nonvolatile memory system and to apply said data to said nonvolatile memories, wherein said nonvolatile memories are enabled to operate a program operation, wherein in said program operation, each of said nonvolatile memories selectively receives said data from said control device, stores said data to said shift register thereof and stores said data in said shift register to ones of said nonvolatile memory cells of that nonvolatile memory, wherein said control device is enabled to receive data from outside of said nonvolatile memory system, while said nonvolatile memories are operating in said program operation, and wherein said shift register has a data storing capacity enabling the transfer of a unit of data of a length equal to the data length of said data to be stored at one time of said program operation, said data length being more than 1 byte.

7. A nonvolatile memory system according to claim 6, wherein each of said nonvolatile memories further includes a plurality of word lines and a plurality of data lines, and wherein each of said nonvolatile memory cells in each of the nonvolatile memories is arranged at a crossing point of a corresponding one of said word lines and a corresponding one of said data lines and is coupled to said corresponding word line and corresponding data line.

8. A nonvolatile memory system according to claim 7, wherein each of said nonvolatile memories includes a plurality of sectors each comprising one word line and ones of the nonvolatile memory cells coupled thereto, and wherein said shift register has a data storing capacity for receiving data in units of a sector and enabling the storing of a unit of data in said sector.

9. A nonvolatile memory system accordance to claim 8, wherein each of said nonvolatile memories is a flash memory.

10. A nonvolatile memory system according to claim 9, wherein said control device includes a host interface comprised of a data bus transceiver, an address bus driver, an address decoder and a control bus controller, to enable communication between the nonvolatile memories and an external system bus.

11. A nonvolatile memory system according to claim 6, wherein said control device includes a host interface comprised of a data bus transceiver, an address bus driver, an address decoder and a control bus controller, to enable communication between the nonvolatile memories and an external system bus.

\* \* \* \* \*

UNITED STATES PATENT AND TRADEMARK OFFICE
CERTIFICATE OF CORRECTION

PATENT NO. : 7,688,643 B2
APPLICATION NO. : 10/809061
DATED : March 30, 2010
INVENTOR(S) : Lofgren et al.

Page 1 of 1

It is certified that error appears in the above-identified patent and that said Letters Patent is hereby corrected as shown below:

On the title page, item [73] "Assignee," please revise to read as follows:

SanDisk Corporation, Milpitas, California (US)
Western Digital Corporation, Lake Forest, California (US)

Signed and Sealed this
Eighth Day of May, 2012

David J. Kappos
*Director of the United States Patent and Trademark Office*